United States Patent
Hack et al.

(10) Patent No.: US 10,177,126 B2
(45) Date of Patent: Jan. 8, 2019

(54) TUNABLE OLED LIGHTING SOURCE

(71) Applicant: Universal Display Corporation, Ewing, NJ (US)

(72) Inventors: Michael Hack, Ewing, NJ (US); Michael S. Weaver, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/956,611

(22) Filed: Dec. 2, 2015

(65) Prior Publication Data

US 2016/0172330 A1    Jun. 16, 2016

Related U.S. Application Data

(60) Provisional application No. 62/092,481, filed on Dec. 16, 2014.

(51) Int. Cl.
*H01L 25/16* (2006.01)
*H01L 51/52* (2006.01)
*H01L 27/32* (2006.01)

(52) U.S. Cl.
CPC ........ *H01L 25/167* (2013.01); *H01L 27/3267* (2013.01); *H01L 51/524* (2013.01); *H01L 51/5271* (2013.01); *H01L 2251/5361* (2013.01); *H01L 2924/0002* (2013.01)

(58) Field of Classification Search
CPC .. H01L 25/167; H01L 51/5271; H01L 51/524
See application file for complete search history.

(56) References Cited

U.S. PATENT DOCUMENTS

| | | | |
|---|---|---|---|
| 4,769,292 A | | 9/1988 | Tang et al. |
| 5,247,190 A | | 9/1993 | Friend et al. |
| 5,703,436 A | * | 12/1997 | Forrest .................. C09K 11/06 |
| | | | 257/E33.056 |
| 5,707,745 A | | 1/1998 | Forrest et al. |
| 5,834,893 A | | 11/1998 | Bulovic et al. |
| 5,844,363 A | | 12/1998 | Gu et al. |
| 6,013,982 A | | 1/2000 | Thompson et al. |
| 6,087,196 A | | 7/2000 | Sturm et al. |

(Continued)

FOREIGN PATENT DOCUMENTS

| EP | 1238981 | 9/2002 |
|---|---|---|
| JP | 2010/135467 | 6/2010 |

(Continued)

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 1, 4-6 (1999).

*Primary Examiner* — Douglas Menz
(74) *Attorney, Agent, or Firm* — Riverside Law LLP

(57) ABSTRACT

Described herein are devices and methods related to lighting systems that are color tunable and have a long lifetime. In certain embodiments, the device comprises two independently controlled phosphorescent OLED lighting panels coupled together in one package to emit light in one direction. In certain embodiment, aspects of the device are tunable, such as RGB color, color temperature, and luminance.

20 Claims, 4 Drawing Sheets

(56) References Cited

U.S. PATENT DOCUMENTS

| | | |
|---|---|---|
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 7,009,338 B2 | 3/2006 | D'Andrade et al. |
| 7,279,704 B2 | 10/2007 | Walters et al. |
| 7,285,907 B2 | 10/2007 | D'Andrade et al. |
| 7,431,968 B1 | 10/2008 | Shtein et al. |
| 7,968,146 B2 | 6/2011 | Wanger et al. |
| 8,022,623 B2 | 9/2011 | Rogojevic et al. |
| 8,827,488 B2 | 9/2014 | Weaver et al. |
| 2003/0230980 A1 | 12/2003 | Forrest et al. |
| 2004/0174116 A1 | 9/2004 | Lu et al. |
| 2006/0006792 A1 | 1/2006 | Strip |
| 2013/0026452 A1 | 1/2013 | Kottas et al. |
| 2013/0119354 A1 | 5/2013 | Ma et al. |
| 2014/0334146 A1 | 11/2014 | Hack et al. |

FOREIGN PATENT DOCUMENTS

| | | |
|---|---|---|
| WO | 2004/111066 | 12/2004 |
| WO | 2008/044723 | 4/2008 |
| WO | 2008057394 | 5/2008 |
| WO | 2010011390 | 1/2010 |
| WO | 2010/111175 | 9/2010 |

* cited by examiner

TUNABLE OLED LIGHTING SOURCE

CROSS-REFERENCE TO RELATED APPLICATIONS

This application claims priority to U.S. Patent Application Ser. No. 62/092,481, filed Dec. 16, 2014, the entire contents of which are incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to lighting systems and devices comprising organic light emitting diodes that are color tunable and have a long lifetime, as well as methods for making the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

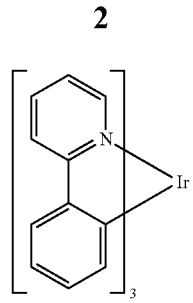

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

While OLED luminaires and other devices have many of the aforementioned advantages, they lack the ability to adjust wavelengths, either to achieve a desired color temperature output or to preserve the life expectancy of an OLED, especially blue light OLEDs which are prone to a shorter lifespan. Current attempts to achieve these features have required the patterning of individual colored OLED emitters and are susceptible to lower lifespans.

There is a need in the art for simple OLED devices that are tunable and have longer lifespans. The present invention meets this need.

SUMMARY OF THE INVENTION

An OLED device is described, comprising a first top emitting OLED unit disposed over a first substrate, the first OLED unit comprising an anode, a cathode, and at least one organic light emitting layer between the anode and cathode, and a second OLED unit disposed over a second substrate, the second OLED unit comprising an anode, a cathode, and at least one organic light emitting layer between the anode and cathode, wherein the second OLED unit and the second substrate are transparent, and wherein the first and second OLED units are sealed between the first and second substrates. In one embodiment, the first OLED is transparent. In one embodiment, the device includes a controller configured to drive the first and second OLED units independently. In one embodiment, the first and second OLED units are hermetically sealed between the first and second substrates. In one embodiment, the device comprises a gap between the first and second OLED units. In one embodiment, at least a portion of the second OLED unit is in direct contact with the first OLED unit. In one embodiment, the first OLED unit includes a thin film encapsulation. In one embodiment, the second OLED unit includes a thin film encapsulation. In one embodiment, the first and second OLED units each include a thin film encapsulation. In one embodiment, at least one light emitting layer of at least one of the first and second OLED units is an emissive stack. In one embodiment, the device is flexible. In one embodiment, the first substrate comprises a metal material. In one embodiment, the first substrate comprises a glass material. In one embodiment, the first substrate comprises a plastic material. In one embodiment, the second substrate comprises a glass material. In one embodiment, the second substrate comprises a plastic material. In one embodiment one of the first or second OLED units emit blue light and the other OLED unit emits yellow or white light. In one embodiment, the blue emitting OLED unit emits only blue light. In one embodiment, the blue emitting OLED unit emits deep blue light in a weak cavity. In one embodiment, the blue emitting OLED emits a light blue light shiftable to deep blue by a microcavity. In one embodiment, a controller regulates the output of the blue emitting OLED unit based on the output of the yellow or white emitting OLED unit. In one embodiment, the blue emitting OLED unit comprises a striped light emitting pattern of at least two colors. In one embodiment, the at least two colors are deep blue and light blue. In one embodiment, the at least two colors are deep blue and green. In one embodiment, the at least two colors are independently driven by a controller. In one embodiment, the at least two colors are formed from at least two different light emitting materials. In one embodiment, the device comprises at least one sensor for recording light color. In one embodiment, the controller regulates the output of light from at least one of the first and second OLED units based on a signal received from the at least one sensor. In one embodiment, the device comprises a reflective layer between the first substrate and the first OLED unit. In one embodiment, the anode of the first OLED unit is reflective and is positioned between the at least one light emitting layer of the first OLED unit and the first substrate. In one embodiment, the first substrate is reflective. In one embodiment, the controller is capable of adjusting the luminance output of the device while maintaining substantially consistent color temperature output of the device by regulating at least one output of the first or second OLED units. In one embodiment, the controller is capable of adjusting the color temperature output of the device by regulating at least one output of the first or second OLED units. In one embodiment, the device comprises at least one out-coupling enhancing technology. In one embodiment, the at least one out-coupling outcoupling enhancing technology is selected from the group consisting of a structured film, a lens, a diffuser, and a scattering layer. In one embodiment, the at least one organic light emitting layers of the first and second OLED units are index matched. In one embodiment, a product comprises the device, the product selected from the group consisting of: a luminaire, a general illumination device, and a sign.

Also described is an OLED device comprising a first top emitting OLED unit disposed over a first substrate, the first OLED unit comprising an anode, a cathode, and at least one organic light emitting layer between the anode and cathode that emits blue light, and a second OLED unit disposed over a second substrate, the second OLED unit comprising an anode, a cathode, and at least one organic light emitting layer between the anode and cathode that emits yellow or white light, wherein the second OLED unit and the second substrate are transparent, and wherein the first and second OLED units are sealed between the first and second substrates. In one embodiment, the first OLED unit is transparent. In one embodiment, the device comprises a controller configured to drive the first and second OLED units independently. In one embodiment, the first and second OLED units are hermetically sealed between the first and second substrates. In one embodiment, the device comprises a gap between the first and second OLED units. In one embodiment, at least a portion of the second OLED unit is in direct contact with the first OLED unit. In one embodiment, the first OLED unit includes a thin film encapsulation. In one embodiment, the second OLED unit includes a thin film encapsulation. In one embodiment, the first and second OLED units each include a thin film encapsulation. In one embodiment, the at least one light emitting layer of at least one of the first and second OLED units is an emissive stack. In one embodiment, the device is flexible. In one embodiment, the first substrate comprises a metal material. In one embodiment, the first substrate comprises a glass material. In one embodiment, the first substrate comprises a plastic material. In one embodiment, the second substrate comprises a glass material. In one embodiment, the second substrate comprises a plastic material. In one embodiment, the first OLED unit emits a deep blue light in a weak cavity. In one embodiment, the first OLED unit emits a deep blue light in a strong cavity. In one embodiment, the first OLED unit emits a light blue light shiftable to deep blue by a microcavity. In one embodiment, a controller regulates the output of the first OLED unit based on the output of the second OLED unit. In one embodiment, the first OLED unit comprises a striped light emitting pattern of at least two colors. In one embodiment, the at least two colors are deep blue and light blue. In one embodiment, the at least two colors are deep blue and green. In one embodiment, the at least two colors are independently driven by a controller. In one embodiment, the at least two colors are formed from at least two different light emitting materials. In one embodiment, the device comprises at least one sensor for recording light color. In one embodiment, a controller regulates the output of light from at least one of the first and second OLED units based on a signal received from the at least one sensor. In one embodiment, the device comprises a reflective layer between the first substrate and the first OLED unit. In one embodiment, the anode of the first OLED unit is reflective and is positioned between the at least one light emitting layer of the first OLED unit and the first substrate. In one embodiment, the first substrate is reflective. In one embodiment, the controller is capable of adjusting the luminance output of the device while maintaining substantially consistent color temperature output of the device by regulating at least one output of the first or second OLED units. In one embodiment, the controller is capable of adjusting the color temperature output of the device by regulating at least one output of the first or second OLED units. In one embodiment, the device comprises at least one out-coupling enhancing technology. In one embodiment, at least one out-coupling enhancing technology is selected from the group consisting of a structured film, a lens, a diffuser, and a scattering layer. In one embodiment, at least one organic light emitting layers of the first and second OLED units are index matched. In one embodiment, a product comprises the device, the product selected from the group consisting of: a luminaire, a general illumination device, and a sign.

According to another embodiment, a first device comprising a first organic light emitting device is also provided. The first organic light emitting device can include an anode, a cathode, and an organic layer, disposed between the anode and the cathode. The first device can be a consumer product, an organic light-emitting device, and/or a lighting panel.

DETAILED DESCRIPTION

Figure 1:
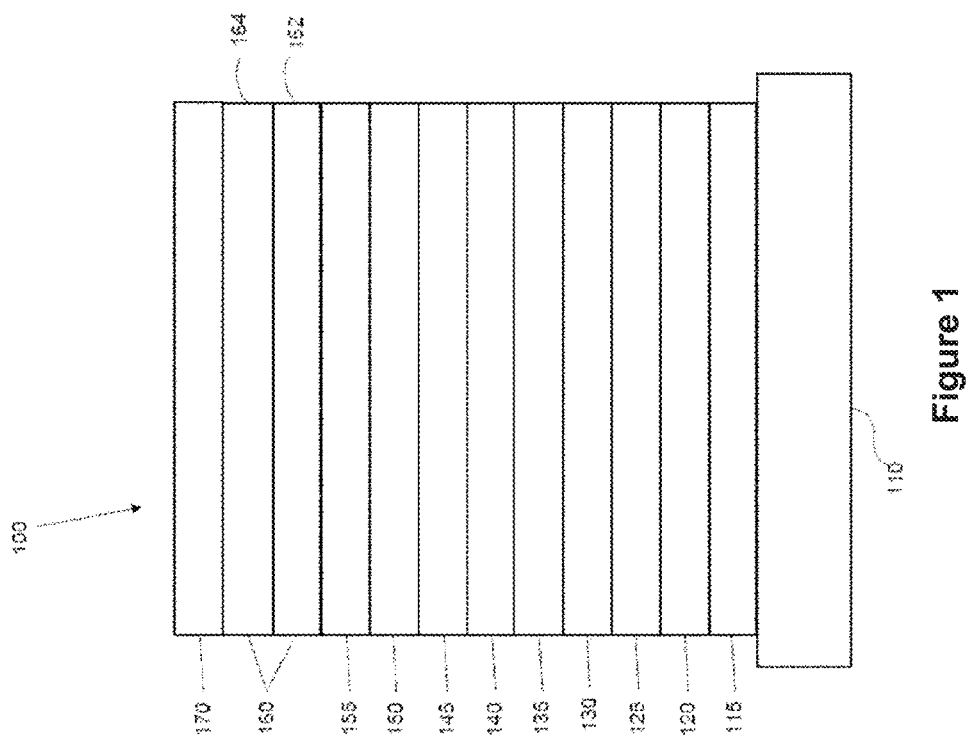
FIG. 1 shows an organic light emitting device.

Unless defined otherwise, all technical and scientific terms used herein have the same meaning as commonly understood by one of ordinary skill in the art to which this invention belongs. As used herein, each of the following terms has the meaning associated with it as described.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, or ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
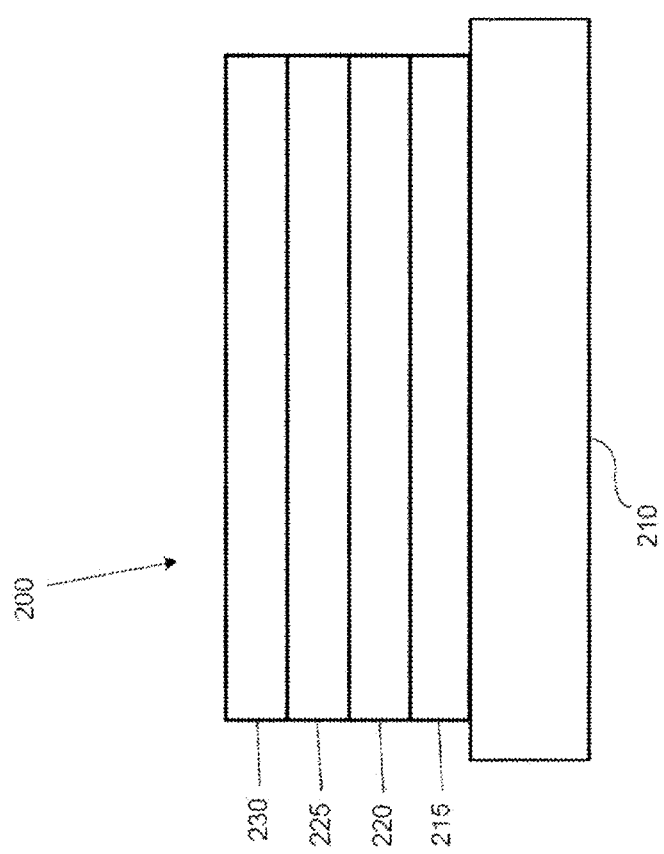
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Figure 3:
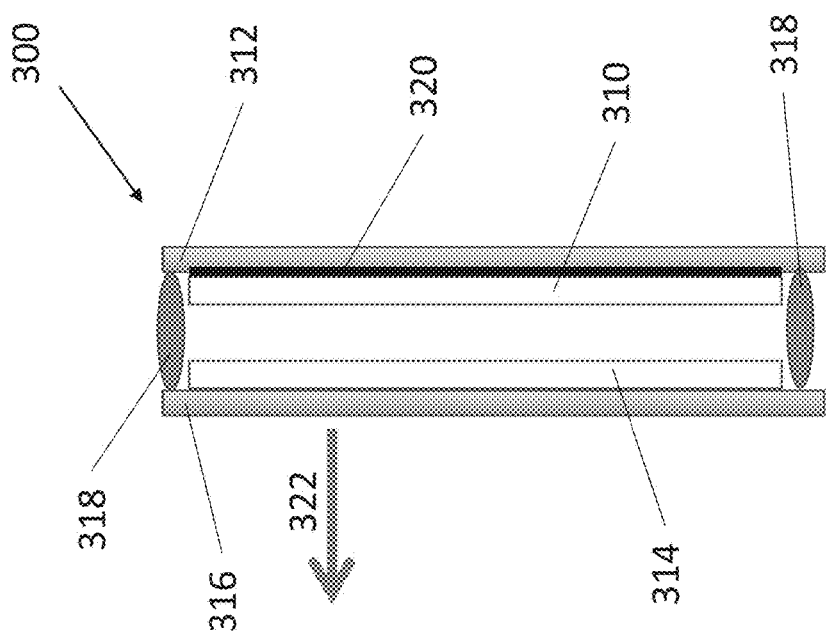
FIG. 3 is a cross-sectional view of an exemplary tunable OLED lighting device illustrating the arrangement of the device components according to one embodiment.

FIG. 3 shows an exemplary tunable OLED lighting device 300. The device emits light 322 and includes a first OLED 310, a first substrate 312, a second OLED 314, a second substrate 316, and sealing material 318 to effectively seal the first and second OLED units 310 and 314 between the first and second substrates 312 and 316. First OLED 310 and second OLED 314 each comprise an anode, a cathode, and at least one organic light emitting layer between the anode and cathode. In some embodiments, only a single emissive layer is used, while in other embodiments, an emissive stack of multiple light emitting layers is used. In certain embodiments, one or both OLED units can be transparent or translucent. In some embodiments, second OLED 314 is transparent, while in other embodiments, first OLED 310 is transparent. In some embodiments second OLED 316 is transparent. First OLED 310 is disposed over first substrate 312, and second OLED 314 is disposed over second substrate 316.

In certain embodiments, the device comprises at least one reflective element. In various embodiments, the reflective element may be at least one reflective layer, at least one reflective electrode, at least one reflective substrate, or combinations thereof. For example, in some embodiments, at least one reflective layer 320 may be disposed between first OLED 310 and first substrate 312. In other embodiments, the anode of first OLED 310 is reflective and is positioned between the at least one light emitting layer of first OLED 310 and first substrate 312. In other embodiments, first substrate 312 is reflective.

The OLED units can be bottom-emitting, top-emitting, or both. As described previously herein, "top" means furthest away from the substrate, while "bottom" means closest to the substrate. A bottom-emitting OLED unit typically comprises a transparent anode and substrate. A top-emitting OLED unit typically comprises a transparent cathode. In certain embodiments, a top-emitting OLED comprises an inverted configuration, wherein the anode is transparent. OLED units that are both top and bottom-emitting, such as transparent OLED (TOLED) units, comprise a transparent cathode, anode, and substrate. There are no limitations to the combination of OLED unit emission types. For example, the device may comprise a top-emitting first OLED unit and a transparent second OLED unit, a transparent first OLED unit and a transparent second OLED unit, or any other combination desired.

The OLED units of the present invention can emit any desired color wavelength. In some embodiments, one OLED unit emits blue light, while the other OLED unit emits yellow or white light. For instance, first OLED 310 may emit blue light, while second OLED 314 may emit yellow or white light. In certain embodiments, an OLED unit may emit a plurality of colors. For example, a single OLED unit may comprise different regions that emit different colors. The different regions may be individually tunable to adjust the emitted colors. The different regions may be patterned, such as a checkerboard pattern, a striped pattern, or a randomized pattern, or independently driven OLED devices may be stacked on top of each other. The emitted light can have any suitable color temperature. In some embodiments, the OLED units emit light having different color temperatures. In some embodiments, the color temperatures of the OLED units are individually tunable, such that adjusting the color of one OLED unit modifies the color temperature of the total light being emitted. For example, increasing the intensity or decreasing the CIE of the color of a blue emitting OLED can increase the color temperature of the light emitted from the yellow or white emitting OLED. Dedicating one OLED unit to blue emission lowers the current density for any given light output, leading to longer device lifetime.

The color of the blue emitting OLED can be selected so that a line joining the white point of the yellow or white emitting OLED to the blue color of the blue emitting OLED closely tracks the black body curve for varying color temperature, or provide the best least squared fit over the color temperature range of interest. In some embodiments, the blue emitting OLED emits a deep blue light in a weak cavity. In some embodiments, the blue emitting OLED emits a deep blue light in a strong cavity. In other embodiments, the blue emitting OLED emits a light blue light shiftable to deep blue by a microcavity. In various embodiments, the blue emitting OLED may comprise a striped light emitting pattern comprising at least two colors. For example, the blue emitting OLED may comprise at least a deep blue color and a light blue color, or a deep blue color and a green color. The at least two colors can be formed from different light emitting materials. As used herein, "green" means having a peak wavelength in the visible spectrum of 500-600 nm, "light blue" means having a peak wavelength in the visible spectrum of 400-500 nm, and "deep blue" means having a peak wavelength in the visible spectrum of 400-500 nm, where "light" and "deep" blue are distinguished by a 4 nm difference in peak wavelength. Preferably, the light blue device has a peak wavelength in the visible spectrum of 465-500 nm, "deep blue" has a peak wavelength in the visible spectrum of 400-465 nm, and "green" has a peak wavelength in the visible spectrum of 510-550 nm.

In other embodiments, the definitions for light and deep blue provided herein may be combined to reach a narrower definition. For example, any of the CIE definitions may be combined with any of the wavelength definitions. The reason for the various definitions is that wavelengths and CIE coordinates have different strengths and weaknesses when it comes to measuring color. For example, lower wavelengths normally correspond to deeper blue. But a very narrow spectrum having a peak at 472 may be considered "deep blue" when compared to another spectrum having a peak at 471 nm, but a significant tail in the spectrum at higher wavelengths. This scenario is best described using CIE coordinates. It is expected that, in view of available materials for OLEDs, that the wavelength-based definitions are well-suited for most situations.

In various embodiments, the device is electrically connected to at least one power source which may contain active components to control the current supplied to the lighting device. These active devices can either be external to the device or integrated onto one or both of the substrates in the form of thin film transistors (TFTs) and other electronic components. The device may include one or more of a timing component, a power source, a controller, a light sensor, a computer-readable memory element, and logic circuitry. In some configurations, a controller may be configured to communicate with, and to provide display data to, one or both of the OLED units. In some embodiments, the controller is configured to drive the first and the second OLED units independently. In some embodiments, the controller is configured to independently drive the colors of a single OLED unit having a plurality of colors. In some embodiments, the controller is configured to adjust the color temperature of one or both of the OLED units, such as by regulating at least one output of one or both OLED units. In some embodiments, the controller adjusts the luminance output of the device. The luminance output may be adjusted while maintaining a substantially consistent color temperature output of the device by regulating at least one output of one or both OLED units. In some embodiments, a light sensor records light color emitted by at least one OLED unit. In some embodiments, a controller regulates the output of light from at least one OLED unit based on a signal received from a light sensor. For example, the controller may regulate the output of the blue emitting OLED unit based on the output of the yellow or white emitting OLED unit, which may be determined by a signal received from at least one light sensor. The light sensor can be any suitable light sensor. For example, in some embodiments, the light sensor is a photoresistor or a photodiode for determining the intensity of emitted light. In other embodiments, the light sensor is a color sensor for determining the hue and temperature of emitted light.

As previously described herein, the OLED units may comprise a barrier that is disposed over the OLED unit. In furtherance to the previous description herein, the barrier may be any type of structure (e.g., covers, plates, films, layers, sheets, etc.). Some of the characteristics of the barrier will vary depending upon the particular application. Such characteristics include the transparency (or opacity), flexibility (or rigidity), or thickness of the barrier. These characteristics can be determined by various factors, including the material composition or dimensions (e.g., thickness) of the barrier.

The barrier can be formed of any suitable material, including inorganic materials, such as metal oxides, metal nitrides, metal carbides, or metal oxynitrides. Other inorganic materials include silicon oxides, silicon nitrides, silicon oxynitrides, aluminum oxides, indium-tin oxides, and zinc indium tin oxides. The barrier may also be made of organic polymers such as parylene, polyesters, polyimides, polyethersulphones, etc. The barrier may also be made of ceramics, including glasses such as borosilicate glass or soda lime.

The barrier may be adhered by using any suitable adhesive material or other bonding technique. In some embodiments, the barrier is adhered by thin film encapsulation. The film may be deposited by any suitable deposition technique, including physical vapor deposition, chemical vapor deposition, plasma-enhanced chemical vapor deposition, spin coating, etc. Such films may be single-layered or multi-layered films. In some cases, the film may be any of the hybrid layers disclosed in U.S. Patent Application Publication No. 2008/0102223 (for application Ser. No. 11/783,361 entitled "Hybrid Layers for Use in Coatings on Electronic Devices or Other Articles" filed on 9 Apr. 2007) or any of the multilayered coatings disclosed in U.S. Patent Application Publication No. 2008/0102206 (for application Ser. No. 11/783,362 entitled "Multilayered Coatings for Use on Electronic Devices or Other Articles" filed 9 Apr. 2007), both of which are incorporated by reference herein in their entirety.

The characteristics of first substrate 312 and second substrate 316 will vary depending upon the particular application. Such characteristics include the transparency (or opacity), flexibility (or rigidity), or permeability of the substrate. The substrate can be formed of any suitable material known to be used in substrates for electronic devices (e.g., metals, glass, polymers, semiconductors, ceramics, etc.), as selected according to the desired characteristics.

Figure 4:
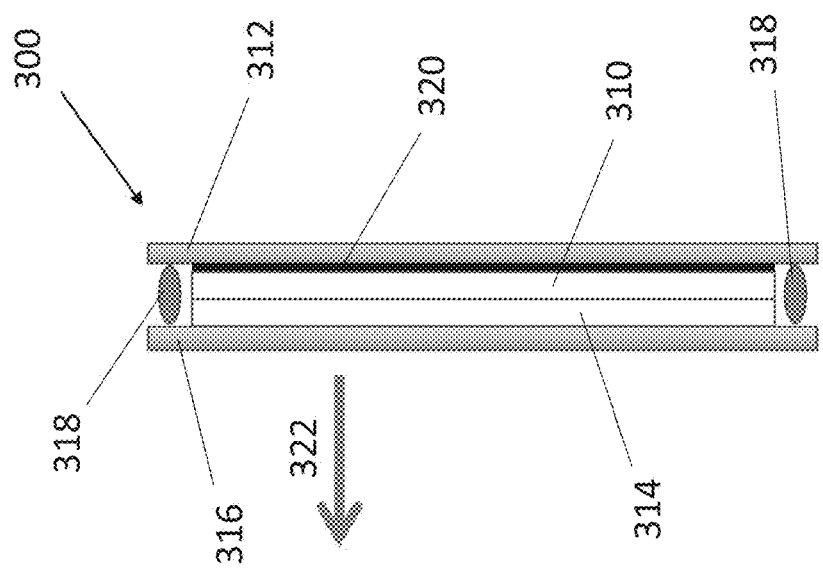
FIG. 4 is a cross-sectional view of an exemplary tunable OLED lighting device illustrating the arrangement of the device components according to one embodiment.

First OLED 310 and second OLED 314 are sealed between first substrate 312 and second substrate 316, such as with sealing material 318. Sealing material 318 can be any suitable material. Non-limiting example of sealing materials include liquid adhesives, such as ultraviolet-curable or thermally curable materials and epoxy materials. In some embodiments, the seal is a hermetic seal. In certain embodiments, at least a portion of the OLED units are in contact, as illustrated in the embodiment shown in FIG. 4. For example, one OLED unit may form the encapsulation lid to the second OLED unit, removing the need for a substrate for the first OLED unit. In certain embodiments, the device comprises an empty gap between first OLED 310 and second OLED 314.

In certain embodiments, the device comprises outcoupling enhancements. For example, outcoupling may be enhanced by filling the gap between the OLED units with an index-matching material. The use of an index-matching material may improve efficiency due to light reflecting back into the OLED at the substrate/air interface. In various embodiments, the index-matching element may be placed in locations on the device other than the gap between the OLED units.

The index-matching component may be provided in various form factors, such as a gel pad, a disposable gel packet, a gel sheet, an encapsulated gel or liquid, or the like. A gel may be considered encapsulated if it is contained within a sealed container, such that the container may be handled by a person without coming in contact with the gel. An encapsulated gel preferably may be somewhat flexible, bendable, or otherwise malleable such that it will fill in irregularities in a surface when placed adjacent to the surface and/or held against the surface under pressure. It also may contain index-matching oil or grease on one or more outside surfaces, for example to help fill imperfections in adjacent surfaces. It may contain or be entirely composed from an index matching material. Such materials include, for example, index matching oil, silicone, fluorocarbon or chlorofluorocarbon, methylene iodide or a mixture of arsenic tribromide, arsenic disulfide and/or sulfur, silica or titania sol, which may be dispersed in a liquid organic polymer such as polyvinylalcohol, silicone hydrogel, or any other hydrogel such as polyacrylamide, or the like, and may have appropriate physical qualities to allow for index matching between the emissive component such as an OLED panel, and the outcoupling component. For example, the index-matching material may have a Young's modulus of 0.1 MPa-1 GPa, and/or an index of refraction of 1.4-2.0. The specific index of refraction may be selected to match the outcoupling component and/or an emissive surface material of the emissive component. For example, it may be selected to be within 90% of the index of refraction of one or both components. The emissive surface material of the emissive component may be the substrate of a bottom-emission or transparent OLED panel, such as glass and plastic. Alternatively, the emissive surface material of the emissive component may be the encapsulation layer of a top-emission or transparent OLED, such as glass, thin-film barrier and lamination sheet. In some embodiments, the index-matching component may be or include oil-type index matching materials as previously described. An oil-type index-matching fluid may be naturally thin relative to the other components, and thus does not add appreciable thickness to the entire luminaire. In some cases, the oil-type material may merely fill gaps or irregularities in the surface of the components or between the components, and thus may add no thickness to the device. However, as previously described, the process of introducing the oil-type fluid to the luminaire may require care and precision to prevent from leaving air bubbles between the interface of the OLED substrate and the luminaire. In addition, the fluid may require cleaning process after the filling. Some index-matching fluids also may require hazard caution, such as high-index matching fluids that contain toxic or potentially-toxic materials such as tin iodide. Thus, in embodiments in which an oil-type fluid is used, it may be preferred for the fluid to be encapsulated within a packet or other structure that can be safely and conveniently handled separately from other components of the device.

To avoid the issues that oil-type materials may present when used alone and injected into a device, in some configurations, the index-matching component may be a deformable component that is sufficiently deformable to conform to irregularities in the surface of an OLED panel or other portion of the organic emissive component, and/or sufficiently deformable to conform to irregularities in the surface of the outcoupling component. For example, the index-matching component may include a gel sheet or similar component that can be placed between the emissive component and the outcoupling component. When pressed between the two, the gel sheet may conform to any irregularities in either surface, and thereby provide improved outcoupling between the components.

Additional outcoupling enhancements can include regions of a transparent material having a low refractive index placed adjacent to regions containing an emissive material, in a direction parallel to one or both of the OLED electrodes. These regions may cause light emitted by the emissive material to enter a glass mode or air mode, increasing the proportion of emitted light that ultimately leaves the device. The low index material can contain a material that has a refractive index that is less than the refractive nidex of the substrate, such as 0.15 to 0.4 less than the refractive index of the substrate. Often the low-index material will have a refractive index lower than the refractive index of the organic materials used in the device, since organic materials used in OLEDs typically have a refractive index of about 1.5-1.7. Various low-index materials may be used for the low-index region, such as Teflon, aerogels, graded films of $SiO_2$ and $TiO_2$, and layers of $SiO_2$ nanorods. Various aerogels are known in the art, such as silica, carbon, alumina, and other aerogels. For example, a silica aerogel can be made by mixing a liquid alcohol with a silicon alkoxide precursor to form a silicon dioxide sol gel. The alcohol is then removed from the gel and replaced with a gas using various techniques known in the art. An aerogel prepared using a sol-gel method may be preferred in some configurations, since the refractive index can be controlled by changing the ratios of the starting solutions. It is also preferred that the low-index material be transparent. As used herein, a material is "transparent" if, at the scale and dimension described for the low-index layers and regions, the total optical loss for light passing through the low-index layer or region in a direction roughly parallel to the electrodes is less than about 50%. The low-index material may also be a non-emissive material.

In certain embodiments, the device comprises outcoupling enhancing technology such as structured films, lenses, diffusers, scattering layers, and the like. Light diffusing layers may be applied to the device using a variety of techniques. These techniques include applying an aerogel to the surface, randomly roughening the surface by means such as abrasion or sand-blasting, depositing a particulate layer onto the surface or patterning microspheres, microlenses or periodic nanostructures onto the surface. An alternative approach is to deposit layers of high and/or low refractive index materials onto the surface. These treatments could be applied directly to the surface of the light extraction block, or to a separate thin film, which is then optically connected to the surface. Yet another alternative approach is to optically connect a prism sheet, lens sheet or diffraction grating sheet to the surface. A still further alternative approach is to optically connect a light diffusing layer, such as a diffuser sheet to the surface. The light diffusing layer could comprise multiple layers or light scattering particles is a host matrix, where the layers and/or scattering particles have higher and/or lower index than the light extraction block. The light diffusing layer could also include additional surface texture to enhance light scattering. In this work, a commercial light scattering diffuser sheet (Clarex DR-80C) was optically connected to the substrate surface using index matching fluid having refractive index n=1.5. Any of these techniques could be used in combination with each other. It should be understood that different portions of light emitting surfaces, e.g. from 0% to 100%, of the light extraction block may be covered with the light diffusing layer, and/or different configurations of light diffusing layers. Although shown typically for ease of description as a single layer covering complete surfaces, various forms of coverage including, for example, patterning, layering, and/or other partial coverages, are contemplated as within the scope of the invention.

As previously described, one use of OLED emissive devices is as flexible lighting and/or display panels. Specifically, flexible OLED lighting panels can be placed into different shapes than conventional non-flexible panels, such as to form attractive and simple luminaires. It may be desirable that each panel in a luminaire is self-supporting, and only require connectivity to a neighboring panel. As disclosed herein, such luminaires may include a single self-supporting OLED panel, an array of self-supporting OLED panels, or one or more self-supporting OLED panels attached to a fixture.

Flexible OLED panels typically deform under their own weight. By intentionally adding a strain to a flexible OLED panel, the panel may be made to take a non-planar three-dimensional shape and become structural. That is, the OLED panel may be able to support itself and/or maintain a non-planar shape without being placed in an external fixture or otherwise requiring a continuous application of external force. The OLED panel may not become completely rigid, so that it will still deform when a certain amount of external force is applied, will return to the original pre-stressed shape when the external force is removed. For example, an OLED panel may be combined with a connector, such as a rigid or flexible rod, which holds the OLED panel into a non-planar shape such as a curved shape. An external force applied to the OLED panel may cause it to assume a different non-planar shape, such as where it is curved more tightly, curved in a direction perpendicular to the first curve, or the like. Upon removal of the external force, the OLED panel may return to the original non-planar shape. As disclosed in further detail herein, various other shapes, configurations, and components may be used.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An OLED device, comprising:
    a first OLED unit deposited over an opaque first substrate, the first OLED unit comprising an anode, a transparent cathode, and at least one organic light emitting layer between the anode and cathode; and
    a second transparent OLED unit deposited over a transparent second substrate, the second OLED unit comprising an anode, a cathode, and at least one organic light emitting layer between the anode and cathode;
    wherein the first and second OLED units are hermetically sealed between the first and second substrates; and
    a controller configured to drive the first and second OLED units independently to:
    adjust the intensity of one or both of the first and second OLED units to modify the color temperature of the emitted light; or
    adjust the luminance output of the device yet maintain a substantially consistent color temperature of the device.

2. The device of claim 1, further comprising an empty gap between the first and second OLED units.

3. The device of claim 1, wherein at least a portion of the second OLED unit is in direct contact with the first OLED unit.

4. The device of claim 1, wherein one of the first or second OLED units emits blue light and the other OLED unit emits yellow or white light, and the blue emitting OLED unit emits only blue light.

5. The device of claim 1, further comprising a reflective layer between the first substrate and the first OLED unit.

6. The device of claim 1, wherein the first substrate is also reflective.

7. The device of claim 1, wherein the first OLED unit emits deep blue light in a weak cavity.

8. The device of claim 1, wherein the first OLED unit emits a light blue light shiftable to deep blue by a microcavity.

9. The device of claim 1, further comprising a light sensor selected from the group consisting of a photoresistor, a photodiode for determining the intensity of emitted light, and a color sensor for determining the hue and temperature of light emitted from the device.

10. The device of claim 1, wherein the at least one organic light emitting layer of the first OLED unit and the at least one organic light emitting layer of the second OLED unit are deposited over the respective substrates by organic vapor jet printing.

11. An OLED device, comprising:
    a first OLED unit deposited over an opaque first substrate, the first OLED unit comprising an anode, a transparent cathode, and at least one organic light emitting layer positioned between the anode and cathode that emits blue light;
    a second OLED unit deposited over a transparent second substrate, the second OLED unit comprising an anode, a cathode, and at least one organic light emitting layer positioned between the anode and cathode that emits yellow or white light; and
    at least one light sensor in communication with a controller;
    wherein the first and second OLED units are hermetically sealed between the first and second substrates.

12. The device of claim 11, wherein the controller is configured to drive the first and second OLED units independently; and the controller regulates the output of the first OLED unit based on the output of the second OLED unit.

13. The device of claim 11, further comprising a gap between the first and second OLED units.

14. The device of claim 11, wherein at least a portion of the second OLED unit is in direct contact with the first OLED unit.

15. The device of claim 11, wherein first OLED unit emits deep blue light in a weak cavity.

16. The device of claim 11, wherein the first OLED unit emits a light blue light shiftable to deep blue by a microcavity.

17. The device of claim 11, further comprising a reflective layer between the first substrate and the first OLED unit.

18. The device of claim 11, wherein the light sensor is selected from the group consisting of a photoresistor, a photodiode for determining the intensity of emitted light, or a color sensor for determining the hue and temperature of light emitted from the device.

19. The device of claim 11, wherein the controller adjusts the intensity of one or both of the first and second OLED units to modify the color temperature of the emitted light.

20. The device of claim 11, wherein the controller adjusts the luminance output of the device yet maintains a substantially consistent color temperature of the device.

\* \* \* \* \*